(12) United States Patent
Domingo et al.

(10) Patent No.: US 7,285,947 B2
(45) Date of Patent: Oct. 23, 2007

(54) POWER METERING USING CURRENT-INDICATIVE SIGNAL

(75) Inventors: Reynaldo P. Domingo, Spring, TX (US); Masud Reza, Houston, TX (US); Hai N. Nguyen, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 155 days.

(21) Appl. No.: 11/216,732

(22) Filed: Aug. 31, 2005

(65) Prior Publication Data

US 2007/0046281 A1 Mar. 1, 2007

(51) Int. Cl.
*G01R 11/32* (2006.01)

(52) U.S. Cl. .................. 324/142; 340/870.02; 702/65

(58) Field of Classification Search .................. None
See application file for complete search history.

(56) References Cited

U.S. PATENT DOCUMENTS 7,012,421 B2 * 3/2006 Lavoie et al. ............... 324/142

* cited by examiner

*Primary Examiner*—Minh N. Tang (57) ABSTRACT

A power meter receives an output-voltage and a current-indicative signal generated by at least one power supply of an electronic system. The output voltage powers at least one electronic component of the electronic system. The current-indicative signal indicates a percentage of a maximum output current capacity at which the power supply is producing current. From the output voltage and the current-indicative signal, the power meter determines the input power received by the power supply.

31 Claims, 5 Drawing Sheets

POWER METERING USING CURRENT-INDICATIVE SIGNAL

BACKGROUND

When many electronic systems are operated at the same time, the amount of electrical power consumed by the systems can be relatively large. For example, a computer server "farm," incorporating hundreds or thousands of computers in a single enterprise or location, consumes a considerable amount of electrical power. The electrical consumption can, thus, be a significant operating cost for the enterprise. It can be advantageous, therefore, to measure and keep track of the electrical power usage of each electronic device or system in order to manage the electrical power consumption of the enterprise.

To determine the power usage of each electronic system, values for the current and voltage generated by a power supply for the system are determined. The power used by the system is calculated from these values. To. obtain these values, the generated current and voltage are measured. These measurements, particularly regarding measurement of current, add to the load on the power supply, due to the use of a sense element, such as a current sense transformer or resistor, in the current path. The sense element measures the voltage drop across it. The voltage drop is relatively low, so it needs to be amplified for proper measurement, thereby requiring additional circuitry. This technique can be difficult to implement because of the need for complex analog circuitry. Additionally, the efficiency of the power supply is reduced due to power loss in the sense element. Furthermore, the added circuitry or components take up valuable space within the electronic system.

DETAILED DESCRIPTION

Figure 1:
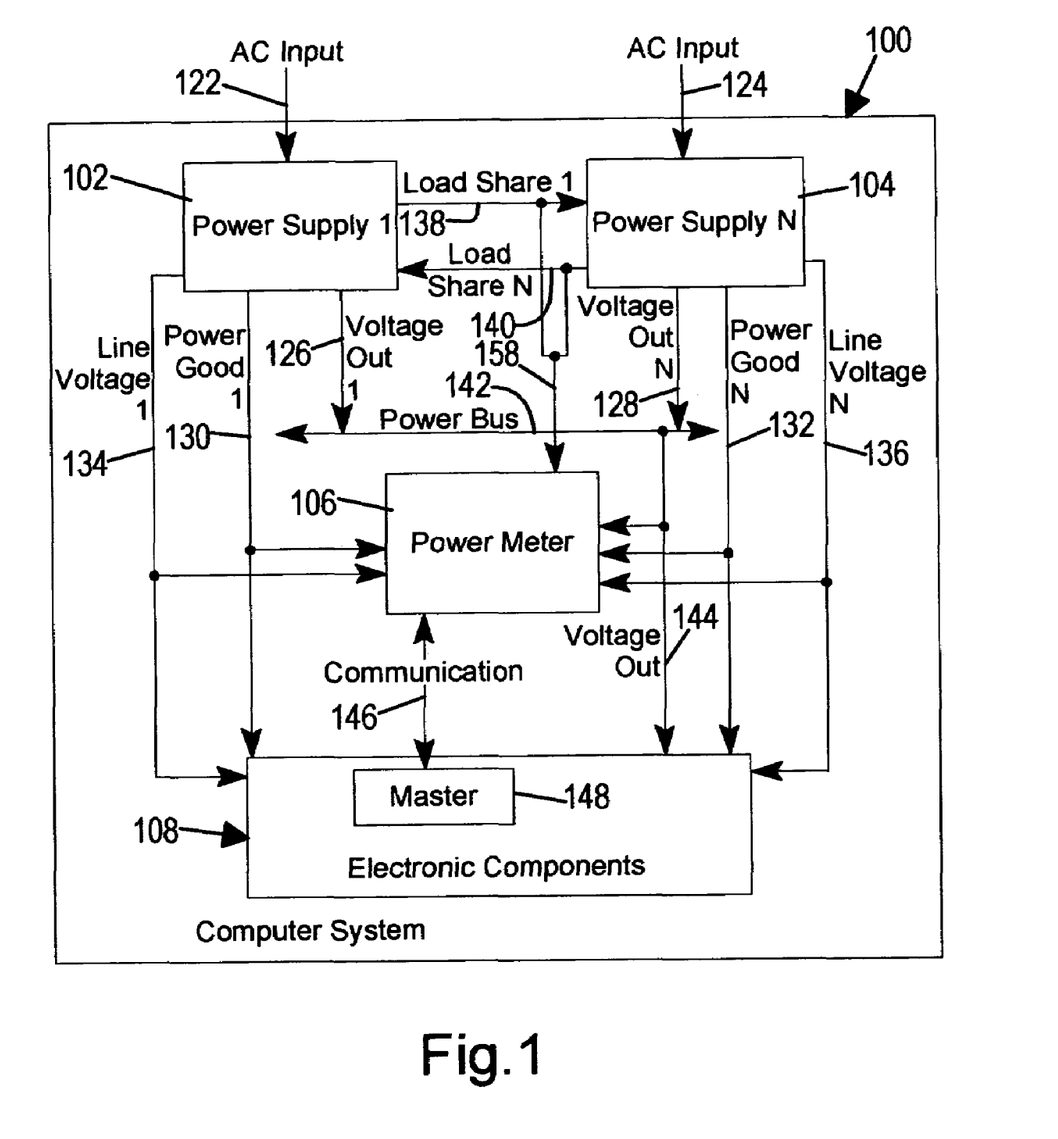
FIG. 1 is a simplified schematic diagram of a computer system incorporating an embodiment of the present invention.
Figure 2:
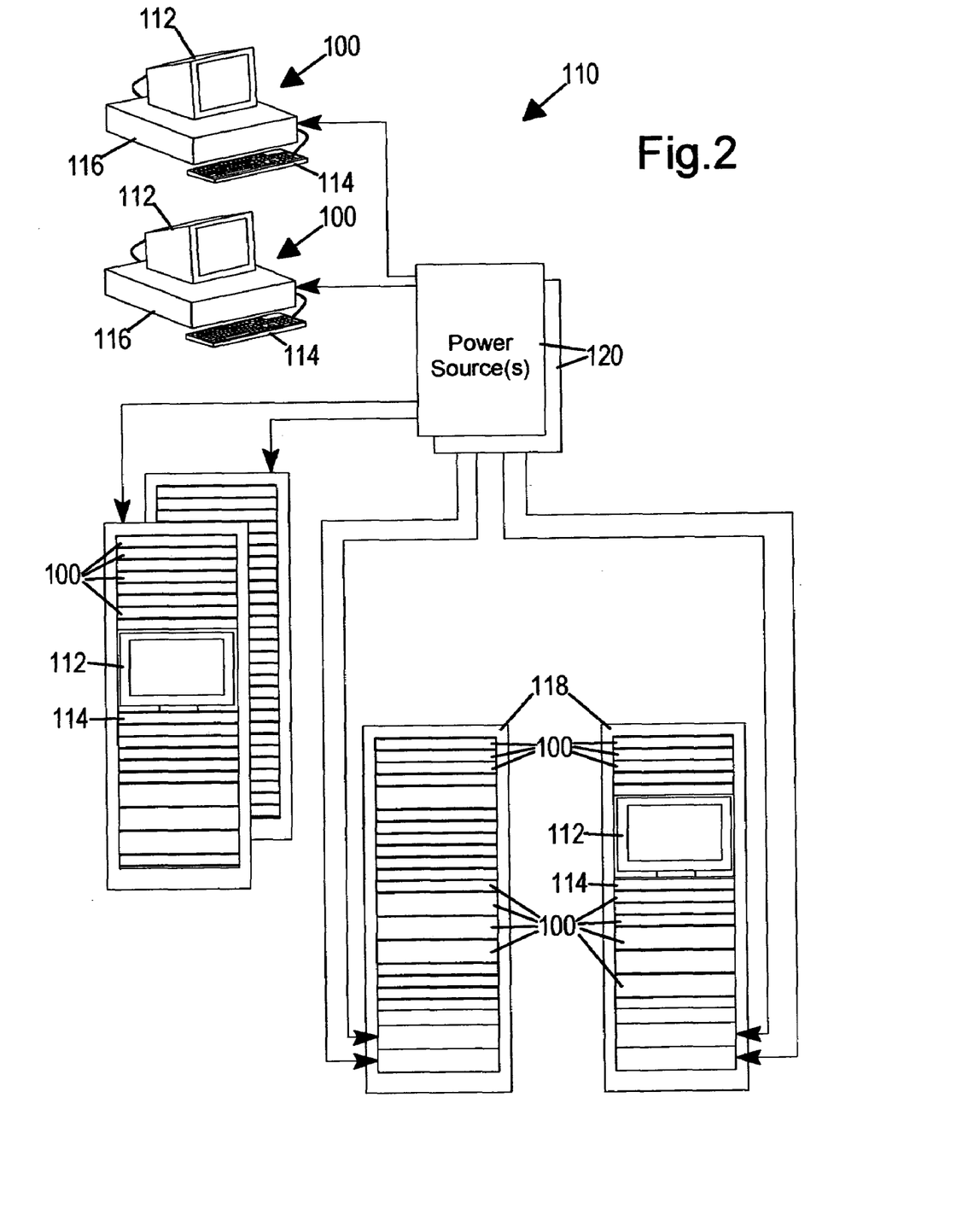
FIG. 2 is a simplified schematic diagram of an enterprise incorporating more than one of the computer system shown in FIG. 1 according to an embodiment of the present invention.

A computer system 100 incorporating an embodiment of the present invention is shown in FIG. 1 having elements such as power supplies (or power supply modules) 102 and 104, a power meter 106 and other electronic components 108. Although the present invention is described with respect to its use in the computer system 100, it is understood that the invention is not so limited, but may be used in any appropriate electronic system that includes a power supply module as described herein, regardless of any other elements included in the electronic system. Additionally, although the computer system 100 is shown having two power supply modules 102 and 104 for simplicity of description, it is understood that the invention is not so limited, but may be used with any appropriate number of power supply modules. Furthermore, although only a single computer system 100 is shown, it is understood that alternative embodiments may include a system or enterprise in which one or more power supplies are used to supply electrical power to multiple computer systems or multiple computer system boards. Such an alternative system may include separate individual computer systems in different housings, as well as a system having multiple computer systems or multiple system boards within a single housing, such as a rack-based system. For example, the computer system 100 may be incorporated in an enterprise 110 that, as shown in FIG. 2, has multiple computer systems 100, some or all of which may have some or all of the features described herein. Such computer systems 100 may be stand-alone systems that also include a display 112 and a keyboard 114, along with a computer housing 116. Alternatively, some of the computer systems 100 may be rack-mounted along with several other computer systems 100 in racks 118 in which the computer systems 100 share displays 112 and keyboards 114. Additionally, the computer systems 100 receive electrical power from one or more AC power sources 120.

As seen in FIG. 1, the power supply modules 102 and 104 receive AC input signals 122 and 124, which may be from the same source 120 (FIG. 2) or different sources 120. The total amount of power received through the AC input signals 122 and 124 by the power supply modules 102 and 104 is the total power usage of the computer system 100. The total power usage of all of the computer systems 100 (FIG. 2) is the total power consumption of the enterprise 110. The power meters 106 in the computer systems 100 in the enterprise 110 aid in the reduction, management and balancing of power usage of the enterprise 110 by efficiently determining the power usage of each computer system 100 that incorporates such a power meter 106.

The power supply modules 102 and 104 generate voltage out signals 126 and 128 (voltage out 1-N), power good signals 130 and 132 (power good 1-N), line voltage signals 134 and 136 (line voltage 1-N) and load share signals 138 and 140 (load share 1-N), respectively. The power supply modules 102 and 104 use the AC input signals 122 and 124 to generate the voltage out signals 126 and 128. The voltage out signals 126 and 128 are combined at a power bus 142, from which a combined voltage out signal 144 is supplied to the other electronic components 108 of the computer system 100, as well as to the power meter 106. The combined voltage out signal 144 powers the various components of the computer system 100.

The power good signals 130 and 132 indicate whether the respective power supply modules 102 and 104 are operating properly. The computer system 100 uses the power good signals 130 and 132 to determine which of the power supply modules 102 and 104 are working. If one of the power supply modules 102 or 104 is not working properly, as indicated by the respective power good signal 130 or 132, then the computer system 100 can generate a notice to a user, or administrator, of the computer system 100 that the non-working power supply module 102 or 104 needs to be replaced.

The line voltage signals 134 and 136 indicate the input line voltage provided by the AC input signals 122 and 124 (e.g. low line at 120 volts AC, high line at 220 volts AC, etc.)

at which the respective power supply modules 102 and 104 are operating. The line voltage signals 134 and 136, thus, may be a single-bit digital signal indicating either high line or low line, a multiple-bit digital signal indicating one of several possible levels for the input line voltage, or an analog signal representing or indicating the actual voltage level of the input line voltage. According to alternative embodiments, however, some power supply modules may be made to use only a single voltage level for the input line voltage and may not generate the line voltage signals 134 and 136. As will be described below, the line voltage signals 134 and 136 aid in the determination of an efficiency of the power supply modules 102 and 104.

Each power supply module 102 and 104 is capable of producing electrical current from a minimum output current capacity (e.g. zero Amps) up to a maximum output current capacity. The load share signals 138 and 140 are current-indicative voltage signals generated by the respective power supply modules 102 and 104. The load share signals 138 and 140 are connected (i.e. short circuited) together in the computer system 100 to form a single load share signal 158. By connecting the load share signals 138 and 140 together, the power supply modules 102 and 104 are forced to share the current load by means of their internal circuitry. The single load share signal 158 indicates a percentage of the maximum output current capacity of the power supply modules 102 and 104. For example, according to an embodiment, the single load share signal 158 may be a voltage signal in a range from zero volts to eight volts representing zero amps (minimum) to one hundred amps (maximum capacity) of current that each power supply module 102 and 104 may be capable of producing. In this example, a value of zero volts for the single load share signal 158 indicates that the power supply modules 102 and 104 are each producing a current of zero amps, or 0% of their maximum output current capacity. A value of eight volts for the single load share signal 158, on the other hand, indicates that the power supply modules 102 and 104 are each producing a current of 100 amps, or 100% of their maximum output current capacity for a total load current of 200 amps. A value of four volts for the single load share signal 158, therefore, indicates that the power supply modules 102 and 104 are each producing a current of 50 amps, or 50% of their maximum output current capacity for a total load current of 100 amps.

Each power supply module 102 and 104 uses the single load share signal 158 to adjust the level of its output current in order to balance, or equalize, its individual share of the total output load current. For example, using the exemplary values above, if one of the power supply modules (e.g. 102) is operating alone to provide a total load current of 100 amps to the components of the computer system 100, then the single load share signal 158 is eight volts. If a second power supply module 104 is then powered up, it initially produces zero amps. The single load share signal 158 is reduced to four volts, which causes the first power supply module 102 to reduce its output current, while causing the second power supply module 104 to increase its output current. As the single load share signal 158 changes to four volts, the output currents of the power supply modules 102 and 104 stabilize, or reach steady state, at the same current, or approximately the same current. In this example, since the total load current is 100 amps, each power supply module 102 and 104 reaches steady state at 50 amps, or one half of the total load current. Additionally, since the maximum output current capacity of each power supply module 102 and 104 is 100 amps, the single load share signal 158 remains at four volts, or 50% of the maximum value.

The power meter 106 receives the combined voltage out signal 144, the power good signals 130 and 132, the line voltage signals 134 and 136 and the single load share signal 158. The power meter 106 uses the combined voltage out signal 144 and the single load share signal 158 to determine the voltage and current, respectively, output by the power supply modules 102 and 104, as described in more detail below. The power meter 106 determines the power output by the power supply modules 102 and 104 based on the output current and voltage. The power meter 106 uses the line voltage signals 134 and 136, if available, to determine the efficiency of the respective power supply modules 102 and 104, as described below with reference to FIGS. 5 and 6. The power meter 106 determines the power input by, or power usage of, the power supply modules 102 and 104 based on the power output by and the efficiency of the power supply modules 102 and 104. The power meter 106 uses the power good signals 130 and 132 to determine which of the power supply modules 102 and 104 are working, so the power meter 106 can determine for which power supply modules 102 and 104 to determine the power usage. The power meter 106 determines the total power usage of the computer system 100 based on the power usage of each of the power supply modules 102 and 104 that has an affirmative power good signal 130 and 132.

The power meter 106 may transmit data regarding the power usage of the computer system 100 through an appropriate communication line 146 to a master device 148. The communication line 146 may involve any appropriate communication system, such as a dedicated wire(s), an available serial or parallel bus system, etc. The master device 148 may be software-based as a procedure operating on a central processing unit (CPU) within the electronic components 108 of the computer system 100. Alternatively, the master device 148 may be a hardware-based device as part of the electronic components 108 or a combination of hardware and software. By gathering the power usage data for the computer system 100, the master device 148 serves as an overall system power monitoring and control logic and aids in the management of the power usage of the computer system 100 and the enterprise 110.

Figure 3:
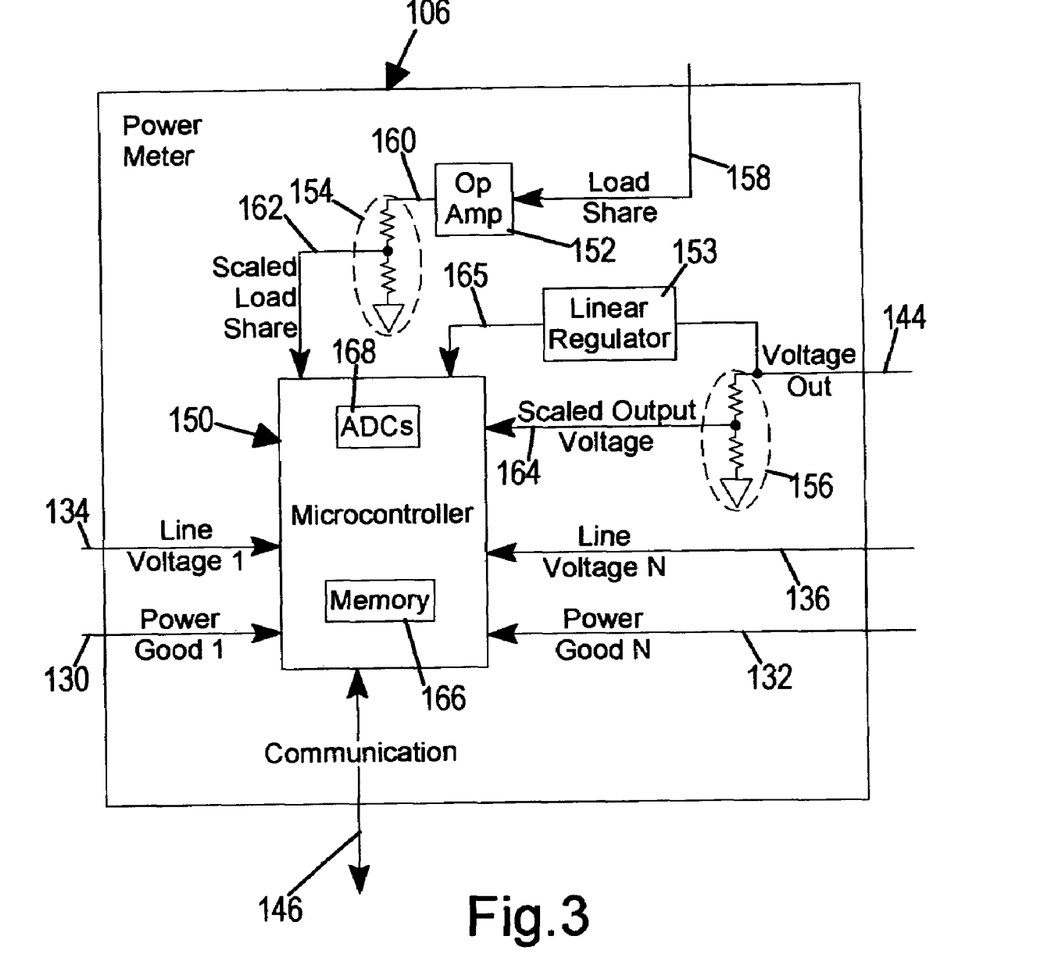
FIG. 3 is a simplified schematic diagram of a power meter for use in the computer system shown in FIG. 1 according to an embodiment of the present invention.

According to a particular embodiment, the power meter 106 generally includes a microcontroller 150, an operational amplifier ("op amp") 152, a linear regulator 153 and voltage dividers 154 and 156, as shown in FIG. 3. The microcontroller 150 may be any appropriate device that has the features described herein, such as the PlCmicro PIC16F88 Flash microcontroller available from Microchip Technology Australia Pty Ltd.

The single load share signal 158 is sent through the op amp 152 to buffer it (buffered load share signal 160). The buffered load share signal 160 is sent through the voltage divider 154 to form a scaled load share signal 162 that is scaled to within a readable range for the microcontroller 150. The scaled load share signal 162 is supplied to the microcontroller 150.

The combined voltage out signal 144 is sent through the other voltage divider 156 to form a scaled output voltage 164 that is scaled to within the readable range for the microcontroller 150. The scaled output voltage 164 is also supplied to the microcontroller 150. The combined voltage out signal 144 is also supplied to the linear regulator 153, which derives a supply voltage 165 that powers the microcontroller 150 and its components.

The line voltage signals 134 and 136 are supplied directly to the microcontroller 150, as shown, in an embodiment in which the line voltage signals 134 and 136 are digital signals. If the line voltage signals 134 and 136 are analog signals, on the other hand, then additional circuitry, such as an op amp, a voltage divider and/or an analog-to-digital converter, may be required to generate a digital representation of the line voltage signals 134 and 136, which is usable for the microcontroller 150.

According to an embodiment, the power good signals 130 and 132 are digital signals. Therefore, the power good signals 130 and 132 may be supplied directly to the microcontroller 150.

The microcontroller 150, according to an embodiment, generally includes a memory 166 and one or more analog-to-digital-converters (ADCs) 168. The memory 166 enables the microcontroller 150 to store the data upon which it operates. The ADCs 168 enable the microcontroller 150 to convert received analog signals, such as the scaled load share signal 162 and the scaled output voltage 164, into digital data, which the microcontroller 150 can store in the memory 166 and operate on as needed. In an embodiment, the ADCs 168 use the supply voltage 165 as a precise reference voltage with which to measure the scaled load share signal 162 and the scaled output voltage 164.

Figure 4:
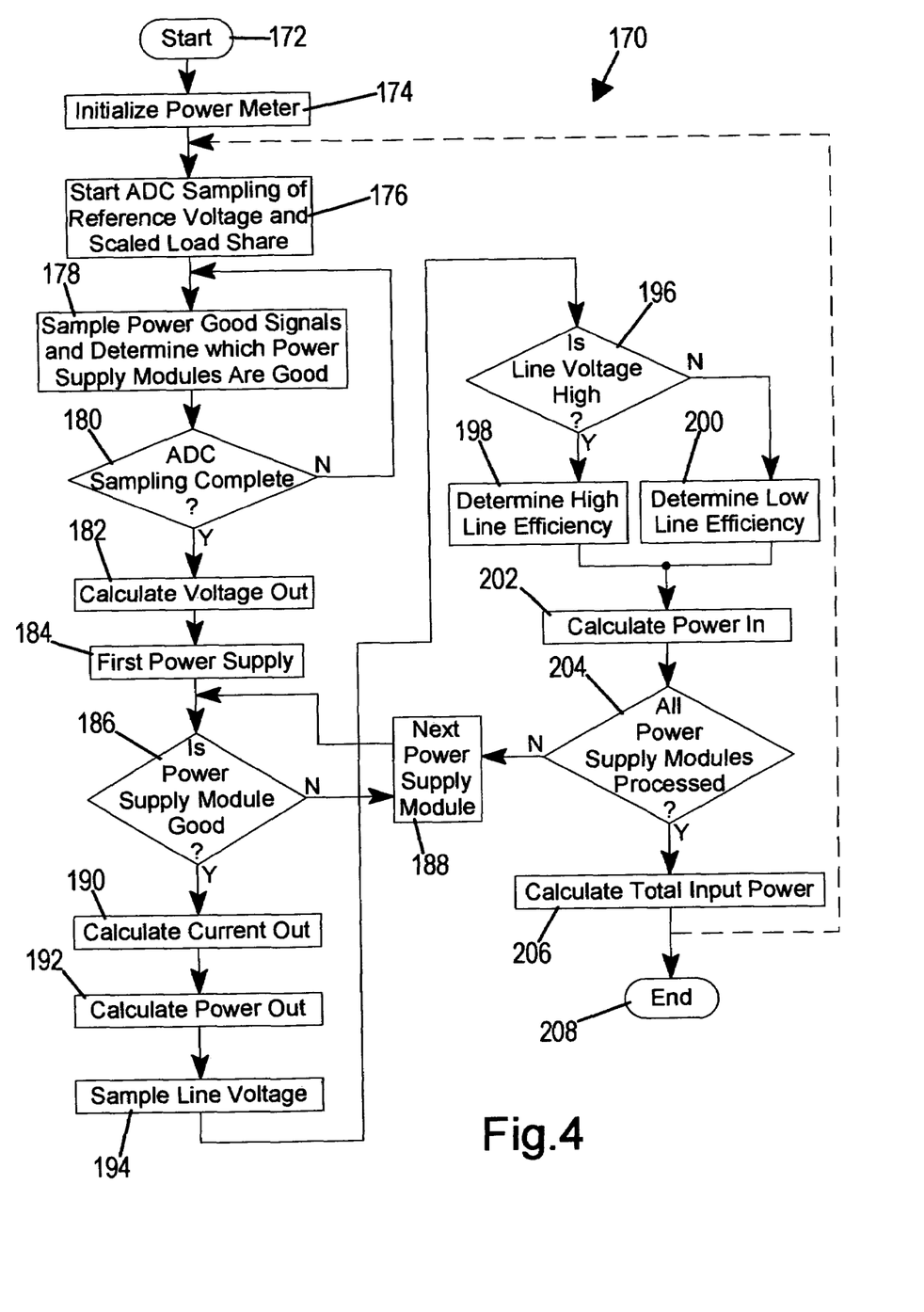
FIG. 4 is a flowchart of a procedure that may be performed by the power meter shown in FIG. 3 according to an embodiment of the present invention.

According to an embodiment, a procedure 170 for the power meter 106, under control of the microcontroller 150, to determine the power usage of the computer system 100 is shown in FIG. 4. Alternative embodiments will be readily discernible for the same configuration of the power meter 106 (FIG. 3) as well as for other configurations thereof. Upon starting (at 172), the power meter 106 is initialized (at 174) to place the power meter 106 into a known initial state from which it can begin operations. The microcontroller 150 starts ADC sampling of the scaled output voltage 164 and the scaled load share signal 162 at 176. In other words, the microcontroller 150 receives (at 176) the analog signals 162 and 164 and converts them to representative digital data using the ADCs 168. The microcontroller 150 stores each sample of the digital data in the memory 166. According to an embodiment, the microcontroller 150 converts and stores the data representative of the signals 162 and 164 repeatedly, thereby obtaining several samples of the data.

The power good signals 130 and 132 are sampled (at 178) and it is determined which power supply modules 102 and 104 (FIG. 1) are good and operating properly. (It is only the "good" power supply modules 102 and 104 that are producing the analog signals 162 and 164 for which the ADC sampling was started at 176.) According to various embodiments, the ADC sampling started at 176 continues for a certain number of samples or for a certain period of time. If the ADC sampling is not completed, as determined at 180, then the power good signals 130 and 132 are again sampled (at 178) and it is again determined which power supply modules 102 and 104 (FIG. 1) are good and operating properly. In this manner, it is ensured that the power supply modules 102 and 104 that are producing the ADC sampled signals 162 and 164 are always properly determined until the ADC sampling is completed.

When the ADC sampling is complete, as determined at 180, the voltage output by the power supply modules 102 and 104, i.e. the combined voltage out signal 144, is calculated at 182. This calculation uses an average of the sampled data for the scaled output voltage 164 and the known effect of the voltage divider 156 (FIG. 3) to determine the voltage output by the power supply modules 102 and 104.

The first power supply module 102 or 104 is selected (at 184) as the current power supply module 102 or 104. It is determined (at 186) whether the current power supply module 102 or 104 is good according to the sampling of the power good signals 130 and 132 at 178. If not, then the next power supply module 102 or 104 is selected at 188 as the new current power supply module 102 or 104. For each power supply module 102 or 104 that is good, as determined at 186, the current output and the power output by the power supply module 102 or 104 are calculated at 190 and 192, respectively. The current output by the power supply module 102 or 104 is determined (at 190) from an average of the sampled data for the scaled load share signal 162, the known effects of the voltage divider 154 and of the op amp 152 and the known relationship of the single load share signal 158 to the current output. The power output by the power supply module 102 or 104 is determined (at 192) from the current output determined at 190 and the voltage output calculated at 182.

The line voltage signal 134 or 136 for the current power supply module 102 or 104, assuming an embodiment in which the line voltage signals 134 and 136 are digital signals, is sampled at 194. (For an embodiment in which the line voltage signals 134 and 136 are analog signals, the digital representation of the line voltage signal 134 or 136 is sampled at 194.) Based on the line voltage signal 134 or 136 sampled at 194, assuming an embodiment in which the line voltage signals 134 and 136 are single-bit digital signals, it is determined at 196 whether the input line voltage received by the current power supply module 102 or 104 is "high." If so, then an efficiency (i.e. high line efficiency) of the power supply module 102 or 104 operating with a high input line voltage is determined at 198. Otherwise, if the input line voltage received by the power supply module 102 or 104 is not high, as determined at 196, then an efficiency (i.e. low line efficiency) of the power supply module 102 or 104 operating with a low input line voltage is determined at 200. For an embodiment in which the line voltage signals 134 and 136 are multiple-bit digital signals, the level for the input line voltage is determined (e.g. at 196) and the appropriate efficiency is determined (e.g. at 198-200). For the embodiment in which the line voltage signals 134 and 136 are analog signals, the level for the input line voltage is determined (e.g. at 196) from the digital representation of the line voltage signal 134 or 136 and the appropriate efficiency is determined (e.g. at 198-200). The determination of the efficiency is described below with reference to FIGS. 5 and 6.

The power input by, or power usage of, the current power supply module 102 or 104 is calculated at 202 based on the power output by the power supply module 102 or 104 determined at 192 and the efficiency of the power supply module 102 or 104 determined at 198 or 200. This calculation may also involve a power factor for the current power supply module 102 or 104 if known. The power factor is a given value supplied for the power supply module 102 or 104 and is stored in the memory 166 (FIG. 3) of the microcontroller 150.

At 204, it is determined whether all of the power supply modules 102 and 104 have been processed. If not, then the next power supply module 102 or 104 is selected at 188 as the new current power supply module 102 or 104. The new current power supply module 102 or 104 is processed, as above, starting at 186. When all of the power supply modules 102 and 104 have been processed, as determined at 204, the total power input to the computer system 100 is calculated (at 206) from the power input to all of the power supply modules 102 and 104. The procedure 170 may then end at 208 or return to 176 to continue monitoring the power usage of the computer system 100.

Figure 5:
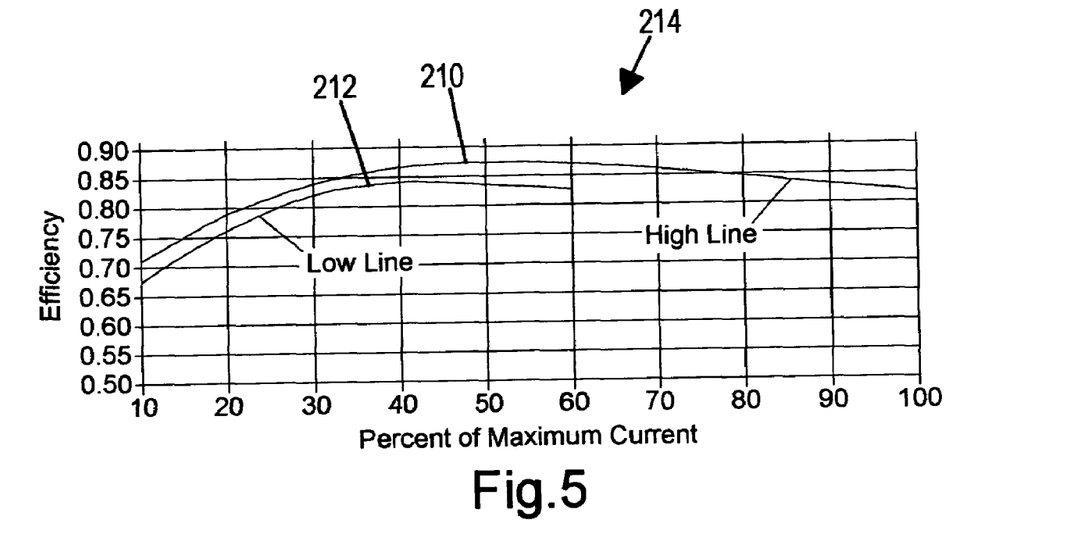
FIG. 5 is a graph of efficiency curves for a power supply that may be incorporated in the computer system shown in FIG. 1 according to an embodiment of the present invention.
Figure 6:
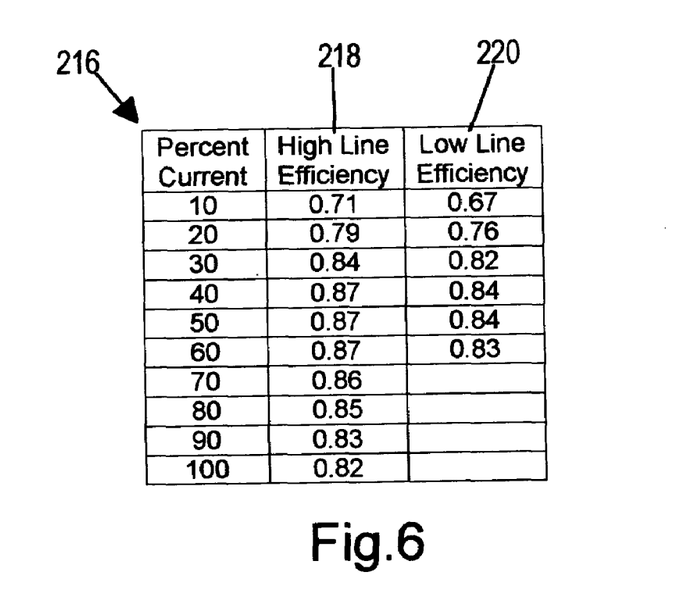
FIG. 6 is a table of efficiency data for a power supply that may be incorporated in the computer system shown in FIG. 1 according to an embodiment of the present invention.

The determination (at 198 and 200 of procedure 170 in FIG. 4) of the efficiency of the power supply module 102 or 104 is based on efficiency curves (such as exemplary efficiency curves 210 and 212 in graph 214 in FIG. 5), from which an efficiency table (such as exemplary efficiency table 216 in FIG. 6) is derived. Although only two exemplary efficiency curves 210 and 212 are shown in FIG. 5 and only two corresponding efficiency columns 218 and 220 are shown in FIG. 6, it is understood that the invention is not so limited. For example, for however many possible levels there are for the input line voltage provided by the AC input signals 122 and 124, there will be a corresponding number of efficiency curves and efficiency columns in FIGS. 5 and 6, respectively. The efficiency curves (e.g. the exemplary efficiency curves 210 and 212) are generally predetermined and based on a statistical average of test data collected from a number of the power supply modules 102 and 104. Thus, other power supply modules 102 and 104 may have differently shaped efficiency curves. The exemplary efficiency curves 210 and 212 and the exemplary efficiency table 216 are exemplary "representations" of the efficiency of the power supply module 102 or 104 relative to output current capacities, given as percentages of the maximum current, at which the power supply module 102 or 104 can operate. The efficiency table (e.g. the exemplary efficiency table 216) is a piece wise linear model of the efficiency curves (e.g. the exemplary efficiency curves 210 and 212) and is stored in the memory 166 (FIG. 3) of the microcontroller 150 of the power meter 106. Additionally, when the power supply module 102 or 104 has multiple efficiency curves (e.g. the exemplary efficiency curves 210 and 212), the efficiency table (e.g. the exemplary efficiency table 216) effectively contains multiple "representations" of the efficiericy of the power supply module 102 or 104. Therefore, given the line voltage signals 134 and 136 (with which the determination of the level of the input line voltage is made at 196 of the procedure 170 in FIG. 4) and the single load share signal 158 (with which the percentage of the maximum current at which the power supply module 102 or 104 can operate is determined), the power meter 106 determines the efficiency of the power supply module 102 or 104 at 198 or 200 of the procedure 170.

We claim:

1. An electronic system, comprising:
at least one electronic component that consumes electrical power;
at least one power supply that receives an input power and generates an output voltage that powers the electronic component and a current-indicative signal that indicates a percentage of a maximum output current capacity at which the power supply is producing current; and
a power meter connected to the power supply to receive the output voltage and the current-indicative signal, from which the power meter determines the input power received by the power supply.

2. An electronic system as defined in claim 1, wherein:
the power meter determines a current output by the power supply based on the current-indicative signal, calculates a power output by the power supply from the received output voltage and the determined current output and calculates the input power received by the power supply based on the calculated power output.

3. An electronic system as defined in claim 1, further comprising:

more than one of the power supply operating together to power the electronic component;
and wherein:
the current-indicative signals generated by the power supplies are combined into a single current-indicative signal; and
each power supply uses the single current-indicative signal to balance the current produced by each power supply.

4. An electronic system as defined in claim 1, further comprising:
more than one of the power supply operating together to power the electronic component;
and wherein:
the power meter calculates a total input power of the power supplies from the determined power input for each power supply.

5. An electronic system as defined in claim 1, further comprising:
more than one of the power supply operating together to power the electronic component;
and wherein:
each power supply generates a power good signal indicating that the power supply is operating to output power; and
the power meter receives the power good signal from each power supply and calculates the power output only by each operating power supply.

6. An electronic system as defined in claim 1, wherein:
the current-indicative signal is a voltage signal between a first voltage and a second voltage;
the first voltage indicates that the power supply is operating at the maximum output current capacity; and
the second voltage indicates that the power supply is operating at a minimum output current capacity.

7. An electronic system as defined in claim 2, wherein:
the power meter determines an efficiency of the power supply; and
the power meter calculates the power input by the power supply from the calculated power output and the determined efficiency.

8. An electronic system as defined in claim 7, wherein:
the power meter includes a memory in which is stored a representation of the efficiency of the power supply relative to output current capacities at which the power supply operates; and
the power meter determines the efficiency of the power supply from the representation of the efficiency based on the output current capacity at which the power supply is operating.

9. An electronic system as defined in claim 8, wherein:
a plurality of representations of the efficiency of the power supply are stored in the memory of the power meter; and
the power meter selects, based on a level of an input line voltage received by the power supply, one of the representations with which to determine the efficiency of the power supply.

10. An electronic system, comprising:
means for receiving an input power;
means for generating power for the electronic system from the input power;
means for generating a current-indicative signal that indicates a percentage of a maximum current at which the means for generating power is generating current; and means for metering power usage of the electronic system by determining the input power from the current-indicative signal and a voltage generated by the means for generating power.

11. An electronic system as defined in claim 10, further comprising:
a plurality of the means for generating power operating together to power the electronic system;
a plurality of the means for generating a plurality of current-indicative signals, each current-indicative signal corresponding to one of the means for generating power;
means for combining the current-indicative signals into a single current-indicative signal; and
means for balancing the current produced by each means for generating power based on the single current-indicative signal.

12. An electronic system as defined in claim 10, wherein:
the current-indicative signal is a voltage signal between a first voltage and a second voltage;
the first voltage indicates that the means for generating power is operating at the maximum output current capacity; and
the second voltage indicates that the means for generating cower is operating at a minimum output current capacity.

13. A power meter for use in an electronic system having at least one power supply that generates a current-indicative signal that indicates a percentage of a maximum output current capacity at which the power supply is producing current, comprising:
an input for the current-indicative signal;
an input for a voltage signal that indicates a voltage output by the power supply; and
a microcontroller that determines a current output by the power supply based on the current-indicative signal, determines the voltage output by the power supply based on the voltage signal, determines a power output by the power supply based on the determined current output and the determined voltage output, and determines a power input by the power supply based on the determined power output.

14. A power meter as defined in claim 13, wherein:
the electronic system has more than one of the power supply operating together to power the electronic system;
the current-indicative signals generated by the power supplies are combined into a single current-indicative signal; and
each power supply uses the single current-indicative signal to balance the current produced by each power supply.

15. A power meter as defined in claim 13, wherein:
the electronic system has more than one of the power supply operating together to power the electronic system;
the power meter calculates a total input power of the power supplies from the determined power input for each power supply.

16. A power meter as defined in claim 13, wherein:
the electronic system has more than one of the power supply operating together to power the electronic system;
each power supply generates a power good signal indicating that the power supply is operating to output power; and
the power meter receives the power good signal from each power supply and determines the power output only by each operating power supply.

17. A power meter as defined in claim 13, wherein:
the current-indicative signal is a voltage signal between a first voltage and a second voltage;
the first voltage indicates that the power supply is operating at the maximum output current capacity; and
the second voltage indicates that the power supply is operating at a minimum output current capacity.

18. A power meter as defined in claim 13, wherein:
the power meter determines an efficiency of the power supply and determines the power input by the power supply from the determined power output and the determined efficiency.

19. A power meter as defined in claim 18, further comprising:
a memory in which is stored a representation of the efficiency of the power supply relative to output current capacities at which the power supply operates;
and wherein the power meter determines the efficiency of the power supply from the representation of the efficiency based on the output current capacity at which the power supply is operating.

20. A power meter as defined in claim 19, wherein:
a plurality of representations of the efficiency of the power supply are stored in the memory; and
the power meter selects, based on a level of an input line voltage received by the power supply, one of the representations with which to determine the efficiency of the power supply.

21. A power meter as defined in claim 13, wherein:
the microcontroller receives signals based on the current-indicative signal and the voltage signal;
the microcontroller includes a first analog-to-digital converter that determines a value of the signal based on the current-indicative signal;
the microcontroller determines the current output by the power supply based on the determined value of the signal based on the current-indicative signal;
the microcontroller includes a second analog-to-digital converter that determines a value of the signal based on the voltage signal; and
the microcontroller determines the voltage output by the power supply based on the determined value of the signal based on the voltage signal.

22. A method for metering power usage of an electronic system having at least one power supply, comprising:
generating a current-indicative signal by the power supply, the current-indicative signal indicating a percentage of a maximum output current capacity at which the power supply is producing current;
determining a current output by the power supply based on the current-indicative signal;
determining a voltage output by the power supply;
calculating a power output by the power supply from the determined voltage output and the determined current output; and
calculating a power input by the power supply based on the calculated power output.

23. A method as defined in claim 22 wherein the electronic system has more than one of the power supply, further comprising:
combining the current-indicative signals generated by the power supplies into a single current-indicative signal; and each power supply using the single current-indicative signal to balance the current output by each power supply.

24. A method as defined in claim 22 wherein the electronic system has more than one of the power supply, further comprising:
calculating a total input power of the power supplies from the calculated power input for each power supply.

25. A method as defined in claim 22 wherein the electronic system has more than one of the power supply, further comprising:
determining which of the power supplies are operating to output power; and
calculating the power output only by each operating power supply.

26. A method as defined in claim 22, wherein:
the current-indicative signal is a voltage signal between a first voltage and a second voltage;
the first voltage indicates that the power supply is operating at the maximum output current capacity; and
the second voltage indicates that the power supply is operating at a minimum output current capacity.

27. A method as defined in claim 22, further comprising:
determining an efficiency of the power supply; and
calculating the power input by the power supply from the calculated power output and the determined efficiency.

28. A method as defined in claim 27, further comprising:
selecting a representation of the efficiency of the power supply relative to output current capacities at which the power supply operates; and
determining the efficiency of the power supply from the representation of the efficiency based on the output current capacity at which the power supply is operating.

29. A method as defined in claim 28, further comprising:
providing a plurality of efficiency representations for the power supply that depend on a level of an input line voltage provided to the power supply.

30. A method as defined in claim 22, further comprising:
generating an output voltage signal by the power supply;
measuring signals based on the output voltage signal and the current-indicative signal;
calculating the voltage output by the power supply from the measured signal based on the output voltage signal; and
calculating the current output by the power supply from the measured signal based on the current-indicative signal.

31. A method as defined in claim 30, further comprising:
taking multiple measurements of the signals based on the output voltage signal and the current-indicative signal;
calculating the voltage output by the power supply from an average of the measured signal based on the output voltage signal; and
calculating the current output by the power supply from an average of the measured signal based on the current-indicative signal.

* * * * *

UNITED STATES PATENT AND TRADEMARK OFFICE
CERTIFICATE OF CORRECTION

| | | |
|---|---|---|
| PATENT NO. | : 7,285,947 B2 | Page 1 of 1 |
| APPLICATION NO. | : 11/216732 | |
| DATED | : October 23, 2007 | |
| INVENTOR(S) | : Reynaldo P. Domingo et al. | |

It is certified that error appears in the above-identified patent and that said Letters Patent is hereby corrected as shown below:

On the title page, in field (75), under "Inventors", in column 1, line 2, delete "Masud" and insert -- Md. Masud --, therefor.

In column 9, line 25, in Claim 12, delete "cower" and insert -- power --, therefor.

Signed and Sealed this

First Day of July, 2008

JON W. DUDAS
*Director of the United States Patent and Trademark Office*